United States Patent
Hirata

[11] Patent Number: 5,666,276
[45] Date of Patent: Sep. 9, 1997

[54] POWER SUPPLY CIRCUIT FOR SELECTIVELY SUPPLYING NORMAL READ VOLTAGE AND HIGH VOLTAGE TO SEMICONDUCTOR MEMORY

[75] Inventor: Masayoshi Hirata, Tokyo, Japan

[73] Assignee: NEC Corporation, Tokyo, Japan

[21] Appl. No.: 394,964

[22] Filed: Feb. 27, 1995

[30] Foreign Application Priority Data

Feb. 28, 1994 [JP] Japan .................... 6-030670

[51] Int. Cl.$^6$ ............................................ H02M 7/00
[52] U.S. Cl. .......................................................... 363/60
[58] Field of Search .................... 363/59, 60; 327/530, 327/535, 536, 538; 365/189.09, 189.11, 226, 227

[56] References Cited

U.S. PATENT DOCUMENTS

| | | | |
|---|---|---|---|
| 4,405,868 | 9/1983 | Lockwood | 363/60 |
| 4,964,084 | 10/1990 | Jung et al. | 365/226 |
| 4,979,088 | 12/1990 | Misaki et al. | 363/60 |
| 5,093,586 | 3/1992 | Asari | 363/60 |
| 5,412,331 | 5/1995 | Jun et al. | 365/230.6 |
| 5,412,337 | 5/1995 | Kumakura | 327/566 |

*Primary Examiner*—Matthew V. Nguyen
*Attorney, Agent, or Firm*—Sughrue, Mion, Zinn, Macpeak & Seas

[57] ABSTRACT

The power supply circuit of the present invention comprises a first transfer circuit provided between a first power supply terminal and a supply voltage output terminal; a second transfer circuit provided between a second power supply terminal and said supply voltage output terminal; a first control circuit for making the first transfer circuit nonconductive at least when a first supply voltage is applied to the first power supply terminal, and a second supply voltage higher than the first supply voltage is applied to the second power supply terminal; and a second control circuit for making the second transfer circuit conductive only when said first supply voltage is applied to the first power supply terminal, and the second supply voltage is applied to the second power supply terminal.

9 Claims, 6 Drawing Sheets

POWER SUPPLY CIRCUIT FOR SELECTIVELY SUPPLYING NORMAL READ VOLTAGE AND HIGH VOLTAGE TO SEMICONDUCTOR MEMORY

BACKGROUND OF THE INVENTION

1. Field of the Invention

The present invention relates to a power supply circuit for semiconductor memory, end, more particularly, to a power supply circuit for a semiconductor memory for the erasing and writing of electrically erasable programmable read-only memory (EEPROM).

2. Description of the Prior Art

The EEPROM is being used in a wide variety of applications because information stored therein can be changed from an external panel or through a remote operation while it is installed in a system.

The EEPROM stores information by charges contained in its cells. A high-field tunneling effect is utilized for the movement of charges in erasing/writing. Writing information to a cell is performed by applying to each node in the cell a voltage corresponding to the content of information, and moving the charges with the high field applied to the insulating film (tunneling implantation). Erasure of information is performed in such ways as by reversing the direction of the electrical field to discharge the accumulated charges. The reading of information is performed by utilizing the change in the threshold of the cell transistor because of the charges accumulated in correspondence to information.

Therefore the EEPROM requires a high voltage necessary for erasing/writing of the cell in addition to voltage for regular memory operation. Generally, it has a voltage switching circuit for switching between the regular voltage and the high voltage in the device.

In the operation of the EEPROM, the voltage switching circuit operates to supply the regular voltage but not high voltage to the memory cell and peripheral circuits in reading information, and to supply high voltage in erasing and writing.

Referring to FIG. 1, there is shown a circuit diagram of a conventional power supply circuit for semiconductor memory for erase/write operations. The conventional power supply circuit for semiconductor memory comprises a transfer circuit 1 for supplying an externally supplied high voltage to an internal power supply terminal $V_{in}$, a transfer circuit 2 for supplying externally supplied normal voltage to the internal power supply terminal $V_{in}$, booster circuit 3 for supplying predetermined boost voltage CP, an oscillator circuit 4 for supplying a pulse signal CK necessary for boosting, a level-shift circuit 5 for supplying voltage $V_{in}$ to the booster circuit 3, and a comparator circuit 6 for comparing difference between the potential at a power supply terminal VC and that at a power supply terminal VP.

The transfer circuit 1 is a transfer gate circuit which is formed by oppositely arranging two N-type enhancement transistors N11 and N12. When voltage vP applied to the power supply terminal VP is higher than the threshold voltage vTN of the transistor N11, the transistor N11 supplies potential vP−vTN to the internal power supply terminal $V_{in}$. In addition, when high voltage vP+vTN or higher is applied to the gate of the transistor N12, the voltage vP is supplied to the internal power supply terminal $V_{in}$ as is.

The transfer circuit 2 is formed by an N-type depletion transistor N21. When it is assumed that the transistor N21 has a gate voltage of vG, a drain voltage of vD, a source voltage of vS, and a threshold voltage of vTD, it becomes nonconductive only when conditions |vG−vD|>vTD and |vG−vS|>vTD are satisfied; otherwise, it becomes conductive.

The booster circuit 3 comprises N-type transistors N31 and N32 which are serially connected, each of which is diode-connected, and the channel of which is not doped with impurities (nondoped), an N-type enhancement transistor N33, a P-type enhancement transistor P31, a zener diode D31, and a capacitance C31 connected at the serial connection point A1 of the transistors N31 and N32.

The transistor P31 is controlled by a signal S1 supplied from the level-shift circuit 5. The transistor supplies the voltage at the terminal $V_{in}$ to the transistor N31 when the signal S1 is at the L level, and does not supply it when the signal S1 is at the H level. Because the transistors N31 and N32 are nondoped, their threshold voltage is substantially −0.3 V. The gate of each of the transistors N31 and N32 is connected to an electrode of the terminal $V_{in}$, that is, the drain. When the potential level of each drain is higher than that of the source, the transistors N31 and N32 are conductive, and otherwise nonconductive. Moreover, the capacitance C31 increases or decreases the potential at the series connection point A1 in response to the supply of the pulse signal CK. Thus, the maximum value of the boost voltage CP, which is an output signal, is voltage vI of an internal power supply VI added to the amplitude of the pulse signal CK. This voltage CP is limited by the zener diode D31 to not exceed a breakdown voltage. In addition, the transistor N33 discharges the boost voltage CP in response to H level of a signal BV supplied from the comparator circuit 6.

The oscillator circuit 4 consists of a NOR gate G41, inverters I41 and I42, a resistor R41, and a capacitance C41. The oscillator circuit 4 stops oscillation when the input signal BV is at the H level so that the pulse signal CK stops and makes its potential level the L level, while it starts oscillation when the signal BV is at the L level so that the pulse signal CK is supplied.

The level-shift circuit 5 consists of P-type enhancement transistors P51 and P52, N-type enhancement transistors N51 and N52, and an inverter I51.

The level-shift circuit 5 functions to shift the level of the signal BV from the level of the voltage vC applied to the power supply terminal VC to the voltage level at the terminal $V_{in}$. Therefore, the level-shift signal S1 is at the L level when the signal BV is at L level, while it is at the voltage level at the terminal $V_{in}$ when the signal BV is at H level.

The comparator circuit 6 consists of an N-type non-doped transistor N61 having the drain and gate connected to the power supply terminal VP, a P-type enhancement transistor P61 having the gate connected to the power supply terminal VC and the source connected to the source of the transistor N61, an N-type enhancement transistor N62 having the gate connected to the power supply terminal VC and the drain connected to the drain of the transistor P61, and an invertor I61. When the voltage vP becomes sufficiently higher than the voltage vC, the transistor P61 is conductive, and the input of the inverter I61 is at the H level. Therefore, the comparison signal BV is at the L level. On the contrary, when the voltage vP becomes below a setting level, the transistor P61 is shut off, and the input of the inverter I61 is at the L level so that the comparison signal BV is at the H level.

The operation of the conventional power supply circuit for semiconductor memory will be explained in the following sections with reference to FIG. 2 and Table 1. The power supply voltage supplied to the internal power supply terminal $V_{in}$ varies depending on the potential levels at the power supply terminal VC and VP. The voltage vC at the terminal VC takes two values of Vl (about 0–2 V) and Vh (about 5 V), while the voltage vP at the terminal VP takes three values of Vl (about 0–2 V), Vh (about 5 V) and Vhh (about 12 V). The combination of the voltage vC and vP can provide six states A, B, C, D, E, and F as shown in Table 1.

Of the states A to F, states which the user usually uses for applying voltage are the states A, C, and F. That is, state A is used for the normal read operation, state C for erase/write operations, and state F for the noncooperation.

State B is not usually used, but provides the same result as state A. States D and E cause problems in the conventional power supply circuit.

TABLE 1

| State | vC | vP | Transfer circuit 1 | 2 | $V_{in}$ |
|---|---|---|---|---|---|
| A | Vh | Vl | X | O | vC |
| B | Vh | Vh | X | O | vC |
| C | Vh | Vhh | O | X | vP |
| D | Vl | Vhh | O | O | Indefinite |
| E | Vl | Vh | O | O | Indefinite |
| F | Vl | Vl | O | O | vC |

Vl = 0–2 V, Vh = 5 V, Vhh = 12 V
O: Conductive, X: Nonconductive

Each operation in states A–F will be explained in detail. First, in state A, because the voltage vP is low relative to the voltage vC, the comparison signal BV output by the comparator circuit 6 becomes the H level. This makes the transistor N21 in the transfer circuit 2 conductive to supply the voltage vC (Vh) to the terminal $V_{in}$. At this point, the oscillator circuit 4 stops oscillation in response to the H level of the signal BV, and makes the signal CK the L level (GND). In addition, because the signal BV is at the H level, and the voltage at the terminal $V_{in}$ is vC (Vh), the level-shift circuit 5 outputs the output signal S1 at the H level (Vh). Thus, in the booster circuit 3, the output signal CP remains at the L level (GND) because the signal S1 is at the H level (Vh), and the signal CK is at the L level. Therefore, the transfer circuit 1 is shut off, and the transfer circuit 2 is conductive to supply the voltage vC to the terminal $V_{in}$.

In state B, because the voltage vP equals the voltage vC, the signal BV is at the H level. Therefore, this state performs the same operation as state A, that is, operation to supply the voltage vC to the terminal $V_{in}$.

State C is a state where the voltage vP=Vhh, and the voltage vC=Vh, and, therefore, the comparison signal BV, becomes the L level. This causes the transistor N11 of the transfer circuit 1 to supply potential vP–vTN to the terminal $V_{in}$. At this point, the oscillator circuit 4 starts oscillation in response to the L level of the signal BV and supplies the pulse signal CK. In addition, the level-shift circuit 5 outputs the output signal S1 at the L level in response to the signal BV at the L level. Thus, the booster circuit 3 is supplied with the voltage vP, and provides the boost voltage CP as its output in response to the supply of the pulse signal CK. When the potential of the boost voltage CP exceeds vP+vTN, the transistor N12 becomes conductive so that the voltage vP (Vhh) is supplied to the terminal $V_{in}$ as is.

Each of states D, E, and F is a state where the voltage vC at the terminal $V_{in}$ is Vl, and where all of the circuits using the voltage vC, that is, the oscillator circuit 4, the level-shift circuit 5, and the comparator circuit 6, do not operate. Thus, the pulse signal CK of the oscillator circuit 4 and the output signal BV of the comparator circuit 6 become the L level. In addition, the output signal S1 of the level-shift circuit 5 varies depending on the voltage vl, and its signal level is vP–vTP where vTP is the threshold of the transistors P51 and P52.

In states D and E, the transistor N11 of the transfer circuit 1 becomes conductive to supply the potential vP–vTN to the terminal $V_{in}$. However, because the terminal $V_c$ is at voltage level Vl and does not satisfy the nonconduction condition, the N-type depletion transistor N21 of the transfer circuit 2 is conductive. Then, the current to be primarily shut off or the leakage current flows from the terminal $V_{in}$ to the terminal VC. As a result, the voltage at the terminal $V_{in}$ has an indefinite value which is determined by the split ratio of conduction resistance of the transistors N11 and N21 as indicated by the broken line in FIG. 2.

In state F, the transfer circuit 1 becomes non-conductive, the transfer circuit 2 becomes conductive, and the voltage at the terminal $V_{in}$ becomes vC (Vl).

The conventional power supply circuit for semiconductor memory described above has a switching circuit for selectively supplying either one of the supply voltage for regular operation and the boost supply voltage for erase/write operations to an internal power supply. In states D and E, however, there arises a disadvantage such that an uncontrollable current or leakage current is generated from the internal power supply terminal to the power supply terminal for regular operation so that the internal power supply becomes indefinite.

BRIEF SUMMARY OF THE INVENTION

Object of the Invention

Accordingly, the object of the present invention is to provide a power supply circuit in which an internal power supply does not become indefinite even when a high-level voltage is applied to a high-voltage application terminal prior to the application of regular voltage.

Summary of the Invention

The power supply circuit according to the present invention comprises a first transfer circuit provided between a first power supply terminal and the supply voltage output terminal, a second transfer circuit provided between a second power supply terminal and a supply voltage output terminal, a first control means for making the first transfer circuit nonconductive at least when a first supply voltage is applied to the first power supply terminal, and a second supply voltage higher than the first supply voltage is applied to the second power supply terminal, and a second control means for making the second transfer circuit conductive only when the first supply voltage is applied to the first power supply terminal, and the second supply voltage is applied to the second power supply terminal.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DESCRIPTION OF THE PREFERRED EMBODIMENTS

Figure 1:
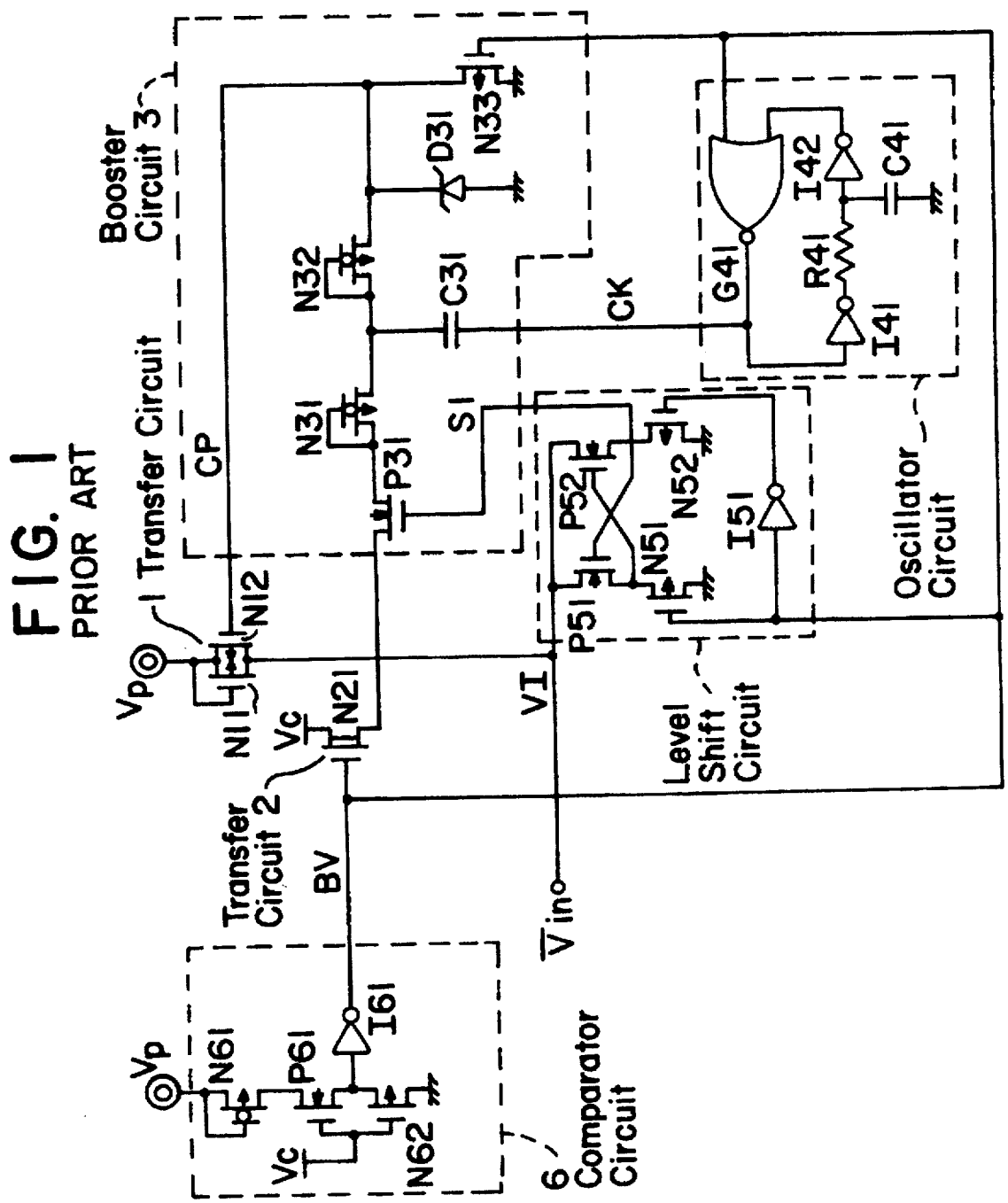
FIG. 1 is a circuit diagram showing a conventional power supply circuit for semiconductor memory devices.
Figure 2:
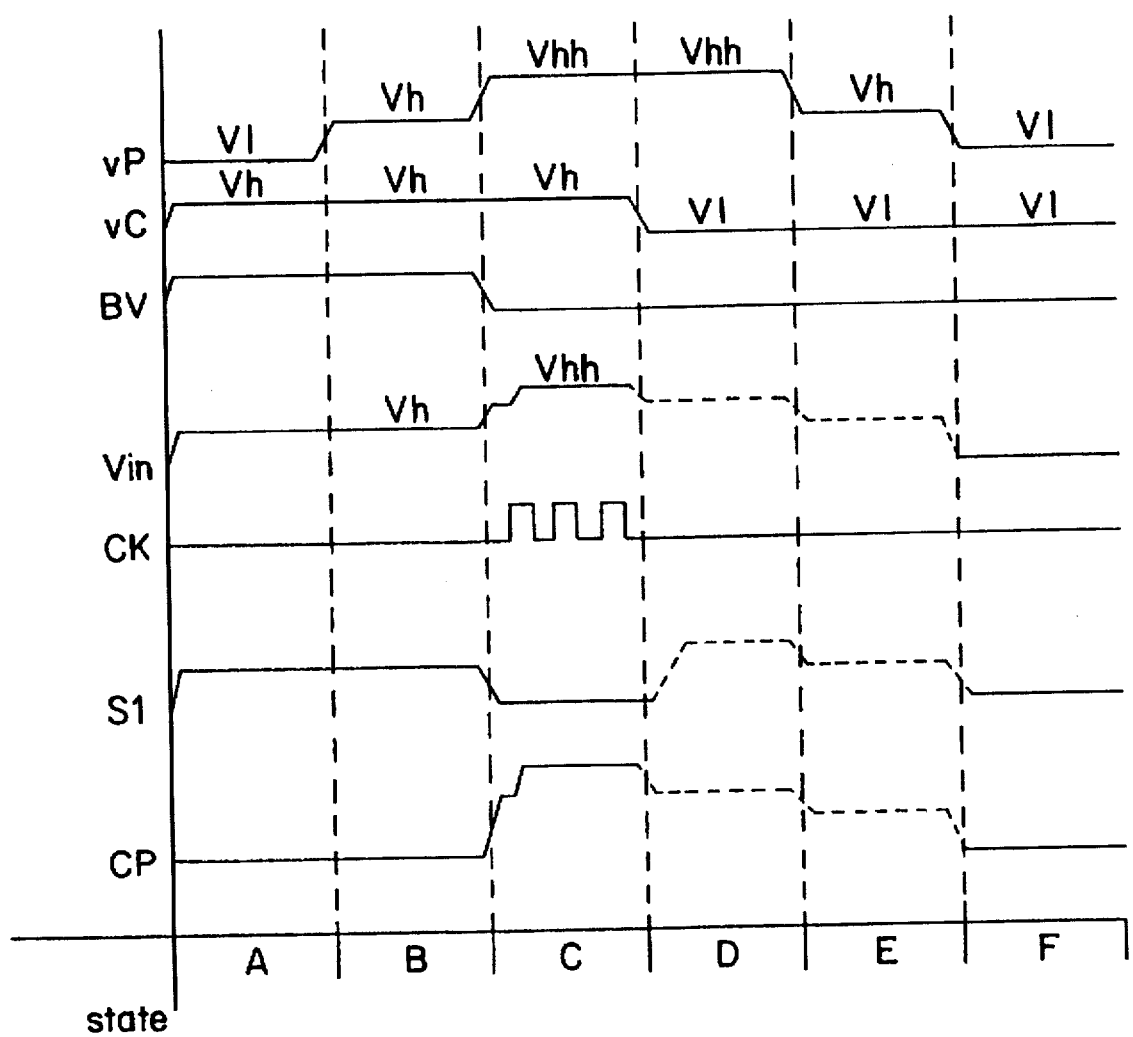
FIG. 2 is waveforms illustrating the operation of the power supply circuit shown in FIG. 1.
Figure 3:
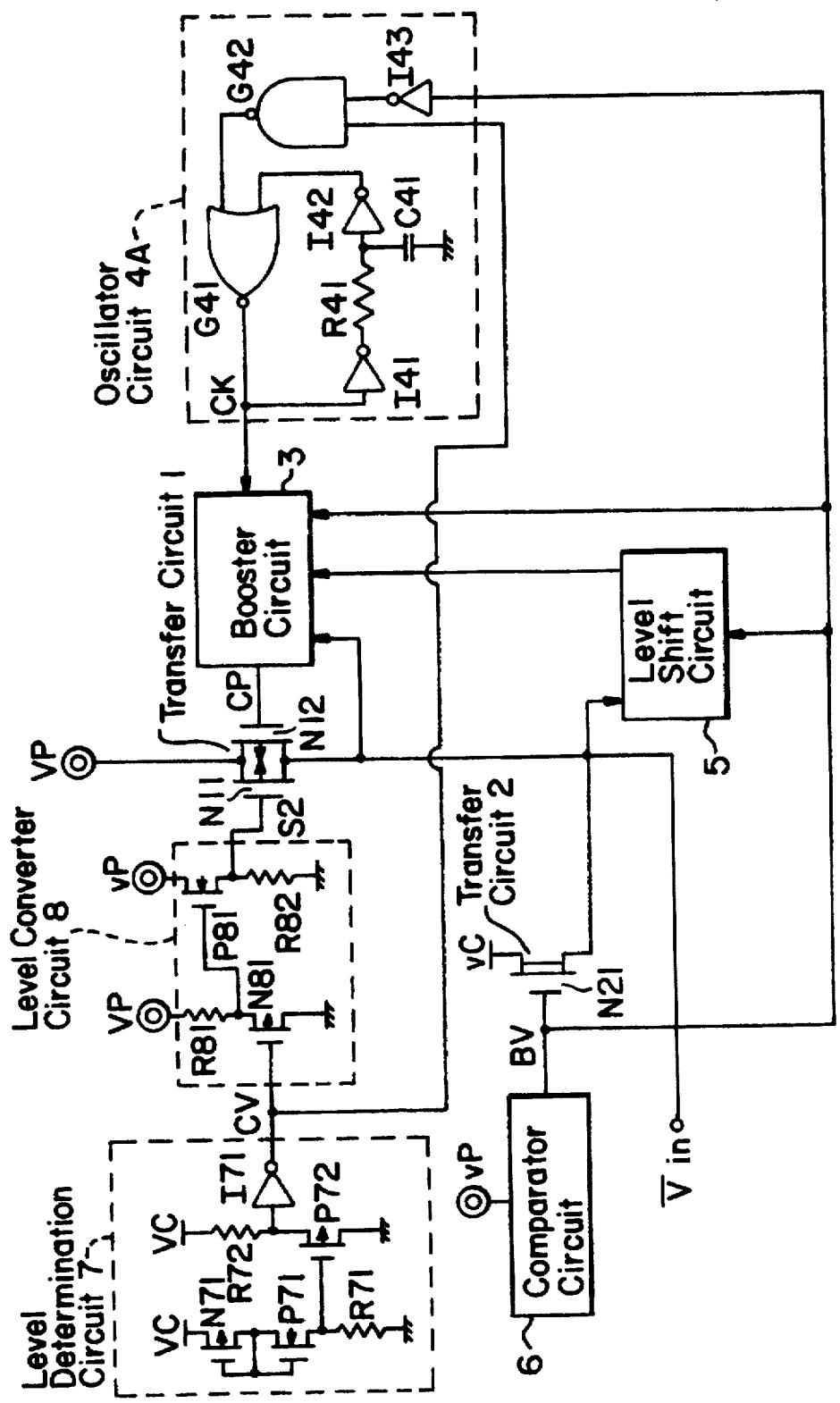
FIG. 3 is a circuit diagram of the power supply circuit for semiconductor memory device showing a first embodiment of the present invention.

Now, the first embodiment of the present invention will be described with reference to FIG. 3 which is a circuit diagram using similar references indicating like components in FIG. 1. Main differences in the construction from FIG. 1 lie in the facts that the transistor N11 constituting the transfer circuit has the gate supplied with the output S2 of a level converter circuit 8, and that an oscillator circuit 4A has a NAND gate G42 and an inverter I43 which serve for logical operation of the signal BV and a determination signal CV.

A level determination circuit 7 comprises an N-type transistor N71 and a P-type transistor P71 which are serially connected, each of which is diode-connected, and the channel of which is not doped with impurities, an N-type enhancement transistor N72, an inverter I71, and resisters R71 and R72, and outputs a signal CV after determining the level difference of the voltage vC set by the thresholds of the transistors N71 and P71 and applied to the terminal VC to a preset value. Because the transistors N71 and P71 have a nondoped structure, they have the thresholds eliminated for variation due to doping, and, as is well known, values of about −0.3 V and −2.3 V. In addition, because they are serially connected, the combined threshold is about 2 V. That is, when the voltage vC becomes below the preset value or 2 V, the transistors N71 and P71 become nonconductive, and the gate of the transistor P72 becomes the L level. Therefore, the level determination signal CV becomes the L level. On the contrary, when the voltage vC exceeds the preset value (2 V), the transistors N71 and P71 become conductive. Because the resistance of the resistor R71 to the ground of the transistor P71 is set to a value considerably higher than the ON-state resistance of these transistors, the gate of transistor P72 becomes the H level, and, therefore, the level determination signal CV becomes the H level.

The level converter circuit 8 comprises an N-type enhancement transistor N81 which has the gate supplied with the signal CV and the source connected to the ground, a P-type enhancement transistor P81 which has the source and the gate connected to the power supply and the drain of the transistor N81, a resistor R81 one end of which is connected to the terminal VP and the other end of which is connected to the drain of the transistor N81, and a resistor R82 one end of which is connected to the ground and the other end of which is connected to the drain of the transistor P81. When the level of the signal CV is the L level, then the output signal S2 is the L level. When the level of the signal CV is the H level, then the output signal S2 has a level at the voltage vP applied to the terminal VP.

Figure 4:
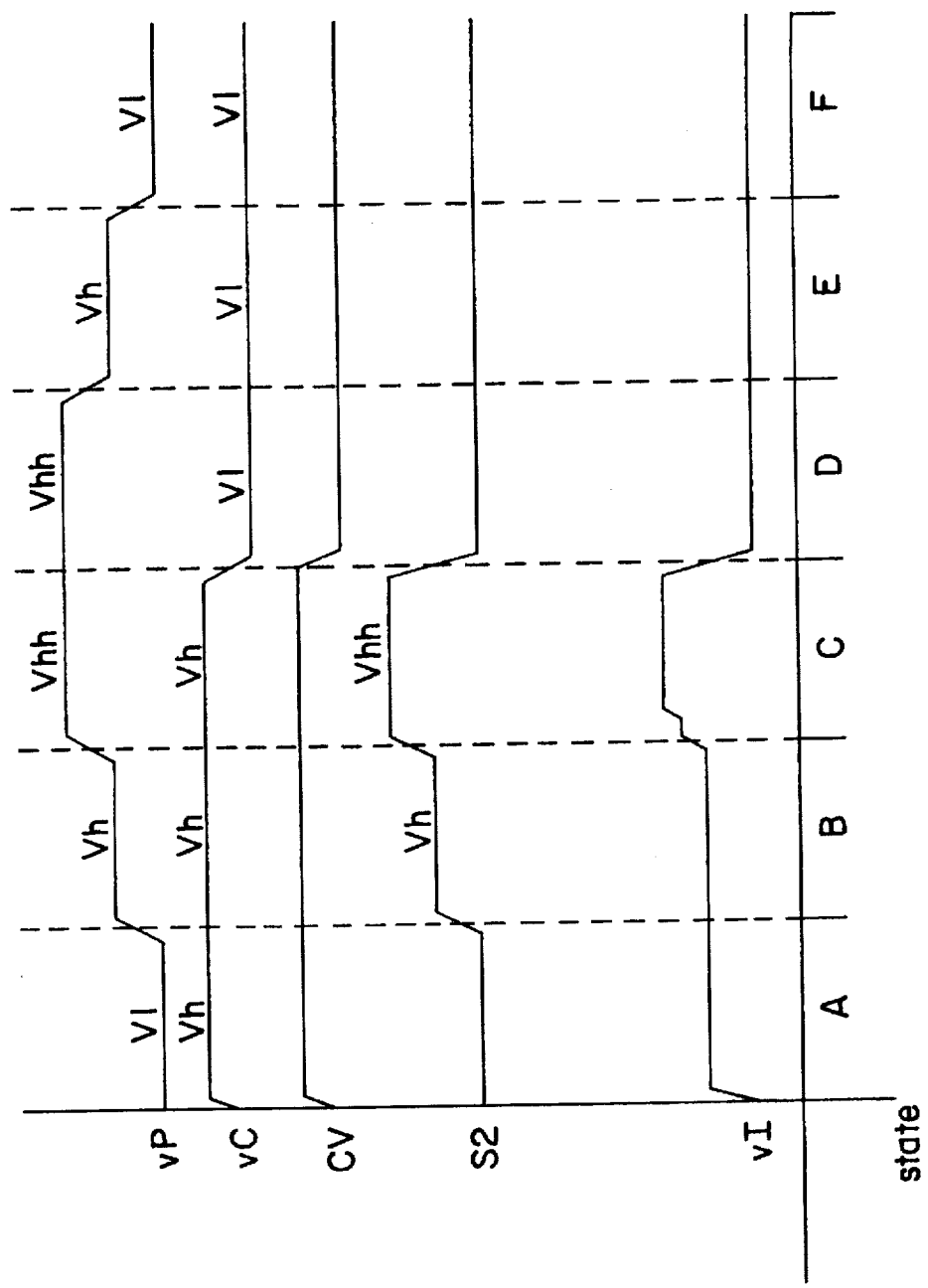
FIG. 4 is waveforms illustrating the operation of the power supply circuit shown in FIG. 3.

The operation of the embodiment will be described in reference to FIG. 4 and Table 2. The conditions for the states A–F are the same as those for the prior art described above. Also, in FIG. 4, because the signals BV and CK are same as those in the prior art, they are omitted in the figure.

TABLE 2

| State | vC | vP | Transfer circuit 1 | 2 | V$_{in}$ |
|---|---|---|---|---|---|
| A | Vh | V1 | X | O | vC |
| B | Vh | Vh | X | O | vC |
| C | Vh | Vhh | O | X | vP |
| D | V1 | Vhh | X | O | vC |
| E | V1 | Vh | X | O | vC |
| F | V1 | V1 | X | O | vC |

V1 = 0–2 V, Vh = 5 V, Vhh = 12 V
O: Conductive, X: Nonconductive

Each operation in states A–F will be explained. First, in state A, because the voltage vC applied to the terminal VC is Vh, the level determination signal CV becomes the H level. In addition because the level of the voltage vP applied to the terminal VP is V1, the output signal S2 of the level converter circuit 8 becomes the L level. Thus, the transistor N11 in the transfer circuit 1 is shut off.

At the moment, the output BV of the comparator circuit 6 becomes the H level, the transistor N21 of the transfer circuit 2 becomes conductive, and the voltage vC (Vb) is supplied to the terminal V$_{in}$.

Then, in state B, the level-determination signal CV becomes the H level as in state A. Contrary to this, since the level of the voltage vP applied to the terminal VP is Vb, the level conversion signal S2 has the level of the voltage vP (Vb) so that the circuit is same as the conventional circuit where the gate of the transistor N11 is connected to the terminal VP. Therefore, the transistor N11 is shut off. In other aspects, the operation is the same as that in state A. That is, the circuit operates to supply the voltage vC (Vb) to the terminal V$_{in}$.

Then in state C, the level determination signal CV becomes the H level, the output signal S2 of the level converter circuit 8 is at the level of the voltage Vhh, and the transistor N11 becomes conductive. In addition, because the booster circuit 3 and the oscillator circuit 4A operate to generate the boost voltage CP, the transistor N12 becomes conductive to supply the voltage VP (Vhh) to the terminal V$_{in}$ as is. At the moment, the output BV of the comparator circuit 6 becomes the L level, and both the gate-source voltage and the gate-drain voltage of the transistor N21 exceed the threshold voltage of the transistor N21 so that the transistor N21 is turned off.

In state D, because the level determination signal CV becomes the L level, the oscillator circuit 4 stops oscillation, and turns the pulse signal CK to the L level. Then, the booster circuit 3 does not boost the internal power supply VI so that the transistor N12 does not conduct. Furthermore, the output signal S2 of the level converter circuit 2 also becomes the L level, and the transistor N11 also becomes nonconductive. Thus, the conduction path between the terminals VP and V$_{in}$ is shut off so that the leakage current is prevented from flowing between these terminals. Although, at the moment, the output signal BV of the comparator circuit 6 is at the L level, because the terminal VC connecting to the transistor N21 is at the L level (V1), the transistor N21 conducts and supplies the voltage VC at the V1 level to the terminal V$_{in}$.

Then, also in state E, because the signal S2 and the level determination signal CV are maintained at the L level, the transistors N11 and N12 are nonconductive as in state D. Although, at the moment, the output signal BV of the comparator circuit 6 is at the L level, because the terminal VC is at the V1 level as in state D, the transistor N21 becomes conductive.

Figure 5:
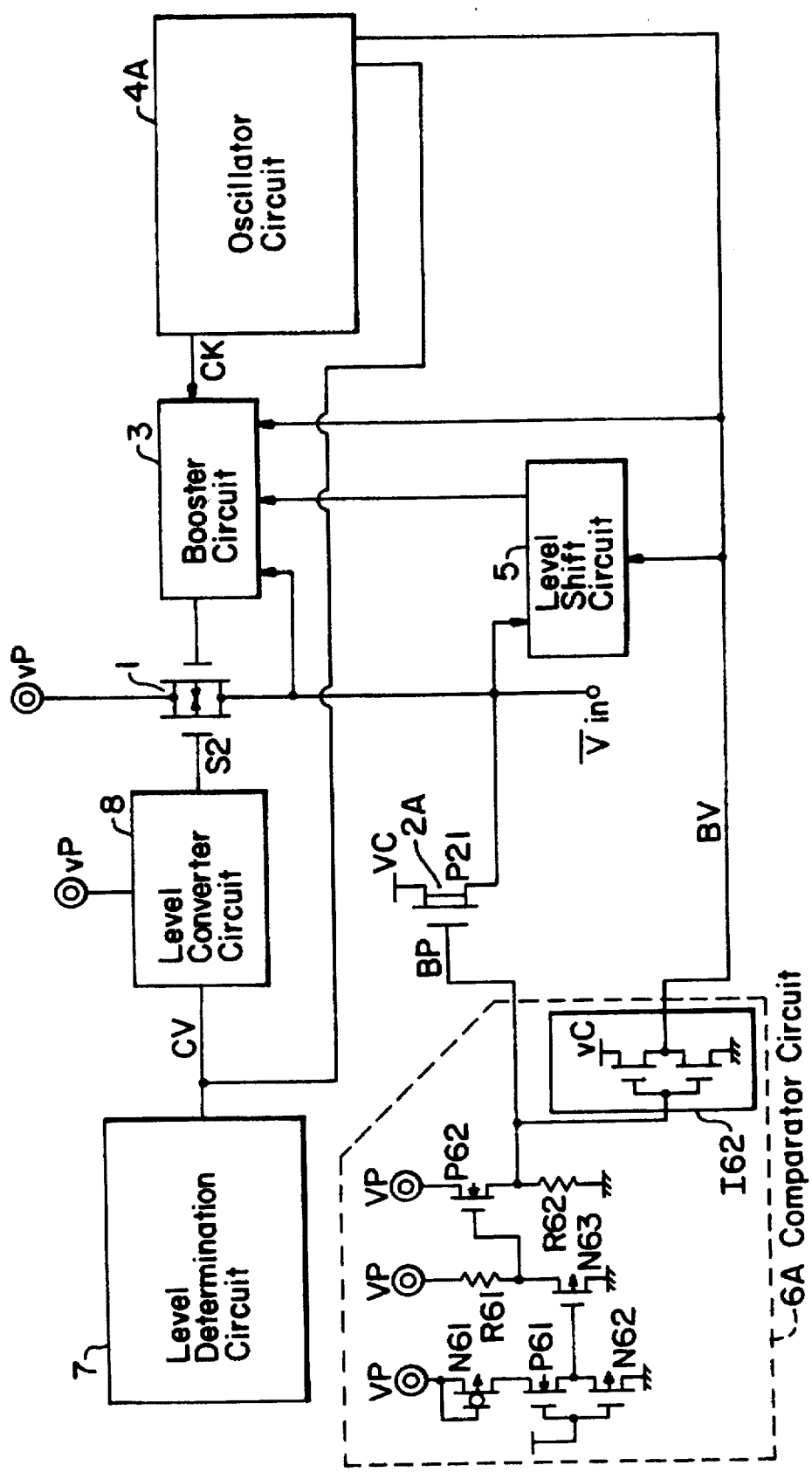
FIG. 5 is a circuit diagram of the power supply circuit showing a second embodiment of the present invention.

The second embodiment of the present invention will be described in reference to FIG. 5 which is a circuit diagram using similar references indicating like components in FIG. 3. The difference of the embodiment shown in this figure from the first embodiment described above lies in that the second embodiment comprises a transfer circuit 2A in place of the transfer circuit 2, which consists of a P-type enhancement transistor P21 with the terminal $V_{in}$ connected to the board, and a comparator circuit 6A in place of the comparator circuit 6 which outputs a comparison signal BP which is at the external supply voltage vP when the voltage vP is higher than a preset potential, and at the L level when the voltage vP is lower than it, and a comparison signal BV which is an inverted signal of the comparison signal BP.

The comparator circuit 6A further comprises a transistor N63, a transistor P62, an inverter I62, and resistors R61 and R62 which are a load of the transistors N63 and P62, respectively, in addition to the transistors N61, P61 and N62 of the comparator circuit 6.

TABLE 3

| State | vC | vP | Transfer circuit 1 | 2 | $V_{in}$ |
|---|---|---|---|---|---|
| A | Vh | V1 | X | O | vC |
| B | Vh | Vh | X | O | vC |
| C | Vh | Vhh | O | X | vP |
| D | V1 | Vhh | X | X | — |
| E | V1 | Vh | X | X | — |
| F | V1 | V1 | X | O | vC |

V1 = 0–2 V, Vh = 5 V, Vhh = 12 V
O: Conductive, X: Nonconductive, —: No power supply A description of this embodiment is omitted because it is the same as for the first embodiment except for the voltage change of the signal BP and the internal power supply voltage vI.

Figure 6:
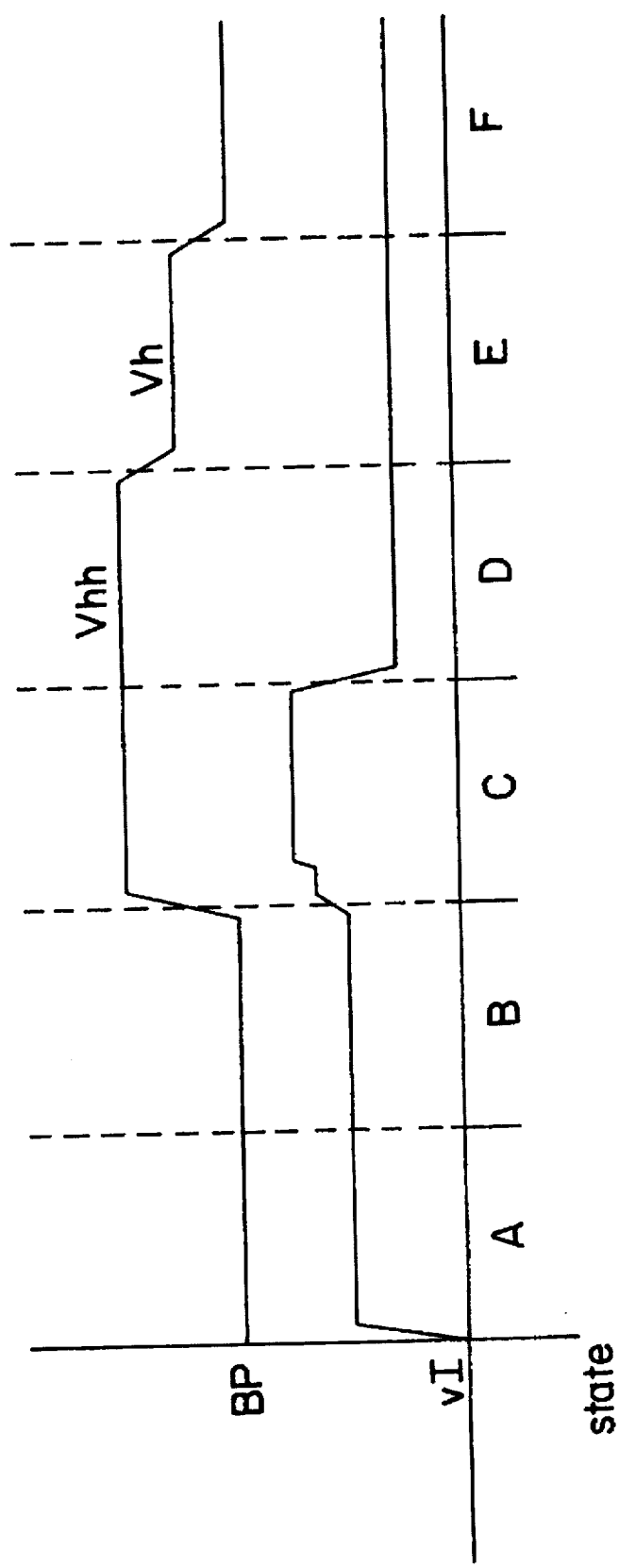
FIG. 6 is waveforms illustrating the operation of the power supply circuit shown in FIG. 5.

The operation of the embodiment will be described in reference to FIG. 6 and Table 3. In states A and B, because the level of the voltage vP applied to the terminal VP is low, the signal BP is at the L level, and the transistor P21 conducts to make the voltage of the terminal $V_{in}$ vC (Vh). At this moment, the transfer circuit 1 is turned off as in the first embodiment.

In states C and D, because the level of the voltage vP is high, the signal BP is at the level of the voltage vP. Therefore, the transistor P21 is turned off in both states. In state C, because the transfer circuit 1 becomes conductive as in the first embodiment, the terminal $V_{in}$ becomes vP (Vhh). In state D, because the level determination signal CV becomes the L level, the transfer circuit 1 also becomes nonconductive, and nothing is output to the terminal $V_{in}$.

In state E, because the level of the voltage vP is Vh to make the level of the signal BP Vh as well, both of the transfer circuits 1 and 2 become nonconductive as in state D.

In state F, as in states A and B, because the level of the signal BP becomes the L level and the transistor P21 conducts, the terminal $V_{in}$ has the potential of the V1 level.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A power supply circuit comprising a first transfer circuit provided between a first power supply terminal and a supply voltage output terminal; a second transfer circuit provided between a second power supply terminal and said supply voltage output terminal, said second transfer circuit, when being activated, forming an electrical path between said second power supply terminal and said supply voltage output terminal to transfer a voltage at said second power supply terminal to said supply voltage output terminal and, when being deactivated, disconnecting said second power supply terminal from said supply voltage output terminal to prevent the voltage at said second power supply terminal from being transferred to said supply voltage output terminal; a first control means for making said first transfer circuit nonconductive when a first supply voltage is applied to said first power supply terminal and a second supply voltage higher than said first supply voltage is applied to said second power supply terminal; and a second control means for activating said second transfer circuit when said first and second supply voltages are applied respectively to said first and second power supply terminals and for deactivating said second transfer circuit when said first supply voltage is not applied to said first power supply terminal and second supply voltage is applied to said second power supply terminal.

2. A power supply circuit claimed in claim 1, wherein said first transfer circuit comprises a first MOS transistor provided between said first power supply terminal and said supply voltage output terminal; said first control means compares voltage applied to said first power supply terminal and said second power supply terminals and supplies to the gate of said first MOS transistor a first control signal at a level making said MOS transistor nonconductive when the first supply voltage is applied to said first power supply terminal and said second supply voltage is applied to said second power supply terminal; said second transfer circuit comprises a second MOS transistor provided between said second power supply terminal and said supply voltage output terminal; and said second control means supplies, to the gate of said second MOS transistor, a second control signal at the voltage level applied to said second power supply terminal when said first supply voltage is applied to said first power supply terminal.

3. A power supply circuit comprising a first transfer circuit provided between a first power supply terminal and a supply voltage output terminal; a second transfer circuit provided between a second power supply terminal and said supply voltage output terminal, said second transfer circuit, when being activated, forming an electrical path between said second power supply terminal and said supply voltage output terminal to transfer a voltage at said second power supply terminal to said supply voltage output terminal and, when being deactivated, disconnecting said second power supply terminal from said supply voltage output terminal to prevent the voltage at said second power supply terminal from being transferred to said supply voltage output terminal; a first control means for making said first transfer circuit nonconductive when a first supply voltage is applied to said first power supply terminal, and a second supply voltage higher than said first supply voltage is applied to said second power supply terminal; and a second control means for activating said second transfer circuit when said first and second supply voltages are applied respectively to said first and second power supply terminals and for deactivating said second transfer circuit when said first supply voltage is not applied to said first power supply terminal and second supply voltage is applied to said second power supply terminal, wherein said second transfer circuit comprises an N-type enhancement transistor provided between said second power supply terminal and said supply voltage output terminal; and said second control means comprises a level detection circuit for detecting the application of a voltage higher than a predetermined voltage to said first power supply terminal, and outputting a detection signal, and a level converter circuit responsive to said detection signal for applying a signal at the voltage level applied to said second power supply terminal to the gate of said second MOS transistor.

4. A power supply circuit claimed in claim 1, wherein said first transfer circuit comprises an N-type depletion transistor provided between said first power supply terminal and said supply voltage output terminal; and said first control means comprises a comparator circuit for supplying a signal at the ground level to the gate of said N-type depletion transistor when said second supply voltage is applied to said second power supply terminal.

5. A power supply circuit claimed in claim 1, wherein said first transfer circuit comprises a P-type enhancement transistor provided between said first power supply terminal and said supply voltage output terminal; and said first control means comprises a comparator circuit for supplying a signal at the voltage level supplied to said second power supply terminal to the gate of said P-type enhancement transistor when said second supply voltage is applied to said second power supply terminal.

6. A power supply circuit claimed in claim 1, wherein said second transfer circuit further comprises a third MOS transistor provided between said first power supply terminal and said supply output voltage terminal; and a booster circuit for supplying a voltage boosted from said second power supply voltage to the gate of said third MOS transistor when said first supply voltage is applied to said first power supply terminal, and said second supply voltage is applied to said second power supply terminal.

7. A power supply circuit comprising a first switching transistor provided between a first power supply terminal and a supply voltage output terminal; a second switching transistor provided between a second power supply terminal and said supply voltage output terminal; a third switching transistor provided between said second power supply terminal and second supply voltage output terminal in parallel to said second switching transistor; a first control means for supplying the gate of said first switching transistor with a first control signal that renders said first switching transistor nonconductive when a first supply voltage is applied to said first power supply terminal and a second supply voltage higher than said first supply voltage is applied to said second power supply terminal; a second control means for supplying the gate of said second switching transistor with a second control signal that renders said second switching transistor conductive when the first supply voltage is applied to said first power supply terminal and said second supply voltage is applied to said second power supply terminal, and a third control means for supplying the gate of said third switching transistor with a third control signal that renders said third switching transistor nonconductive when said first supply voltage is not applied to said first power supply terminal and said second supply voltage is applied to said second power supply terminal.

8. A power supply circuit comprising a first transfer circuit provided between a first power supply terminal and a supply voltage output terminal; a second transfer circuit provided between a second power supply terminal and said supply voltage output terminal, said second transfer circuit, when being activated, forming an electrical path between said second power supply terminal and said supply voltage output terminal to transfer a voltage at said second power supply terminal to said supply voltage output terminal and, when being deactivated, disconnecting said second power supply terminal from said supply voltage output terminal to prevent the voltage at said second power supply terminal from being transferred to said supply voltage output terminal; a first control means for making said first transfer circuit nonconductive when a first supply voltage is applied to said first power supply terminal, and a second supply voltage higher than said first supply voltage is applied to said second power supply terminal; and a second control means for activating said second transfer circuit when said first and second supply voltages are applied respectively to said first and second power supply terminals and for reactivating said second transfer circuit when said first supply voltage is not applied to said first power supply terminal and second supply voltage is applied to said second power supply terminal, wherein said second switching transistor is an N-type enhancement transistor; and said second control means comprises a level detection circuit for detecting application of voltage higher than a predetermined voltage to said first power supply terminal, and outputting a detection signal, and level converter circuit responsive to said detection signal for applying a signal at the voltage level applied to said second power supply terminal to the gate of said second MOS transistor.

9. A power supply circuit claimed in claim 7, wherein said first switching transistor is an N-type depletion transistor; and said first control means comprises a comparator circuit for supplying a signal at the ground level to the gate of said N-type depletion transistor when said second supply voltage is applied to said second power supply terminal.

* * * * *